United States Patent [19]

DiCarlo et al.

[11] Patent Number: 4,596,763

[45] Date of Patent: Jun. 24, 1986

[54] POSITIVE PHOTORESIST PROCESSING WITH MID U-V RANGE EXPOSURE

[75] Inventors: John DiCarlo, Coventry; Jonas St. Alban, Westerly, both of R.I.; Donald C. Mammato, Lebanon; Bruce M. Stevens, Somerville, both of N.J.

[73] Assignee: American Hoechst Corporation, Somerville, N.J.

[21] Appl. No.: 655,824

[22] Filed: Oct. 1, 1984

[51] Int. Cl.$^4$ ................................................. G03F 7/26
[52] U.S. Cl. ..................................... 430/326; 430/189; 430/192; 430/193; 430/165; 430/330; 534/557
[58] Field of Search ............... 430/193, 192, 189, 326; 534/557, 556

[56] References Cited

U.S. PATENT DOCUMENTS

| | | | |
|---|---|---|---|
| 3,046,118 | 7/1962 | Schmidt | 430/193 |
| 3,106,465 | 10/1963 | Neugebauer et al. | 430/193 |
| 3,148,983 | 9/1964 | Endermann et al. | 430/193 |
| 3,188,210 | 6/1965 | Fritz et al. | 430/193 |
| 3,402,044 | 9/1968 | Steinhoff et al. | 430/192 |
| 4,125,650 | 11/1978 | Chiu et al. | 430/193 |
| 4,409,314 | 11/1983 | Buhr et al. | 430/192 |
| 4,467,025 | 8/1984 | Goto et al. | 430/193 |
| 4,499,171 | 2/1985 | Hosaka et al. | 430/193 |
| 4,576,901 | 3/1986 | Stahlhofen et al. | 430/325 |
| 4,581,321 | 4/1986 | Stahlhofen | 430/325 |

OTHER PUBLICATIONS

De Forest, W. S., "Photoresist Matl's & Processes", McGraw-Hill Book Co., 1975, pp. 150-151.

*Primary Examiner*—Charles L. Bowers, Jr.
*Attorney, Agent, or Firm*—Richard S. Roberts; John P. Blasko

[57] ABSTRACT

The invention provides a method for producing a positive working photoresist which comprises coating at least one novolak resin, and 1-naphthalenesulfonic acid, 3-diazo-3,4-dihydro-4-oxo-,4-benzoyl-1,2,3-benzenetriyl ester onto a substrate, exposing to a u.v. light source having a wavelength of less than 380 nanometers and developing with an aqueous alkaline solution.

15 Claims, No Drawings

POSITIVE PHOTORESIST PROCESSING WITH MID U-V RANGE EXPOSURE

BACKGROUND OF THE INVENTION

The present invention relates generally to radiation sensitive positive photoresist compositions and particularly to compositions containing novolak resins together with naphthoquinone diazide sensitizing agents.

It is well known in the art to produce positive photoresist formulations such as those described in U.S. Pat. Nos. 3,666,473, 4,115,128 and 4,173,470. These include alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired.

The novolak resin component of these photoresist formulations is soluble in aqueous alkaline solutions, but the naphthoquinone sensitizer acts as a dissolution rate inhibitor with respect to the resin. Upon exposure of selected areas of the coated substrate to actinic radiation, however, the sensitizer undergoes a radiation induced structural transformation and the exposed areas of the coating are rendered more soluble than the unexposed areas. This difference in solubility rates causes the exposed areas of the photoresist coating to be dissolved when the substrate is immersed in alkaline developing solution while the unexposed areas are largely unaffected, thus producing a positive relief pattern on the substrate.

In most instances, the exposed and developed substrate will be subjected to treatment by a substrate-etchant solution. The photoresist coating protects the coated areas of the substrate from the etchant and thus the etchant is only able to etch the uncoated areas of the substrate, which in the case of a positive photoresist, correspond to the areas that were exposed to actinic radiation. Thus, an etched pattern can be created on the substrate which corresponds to the pattern of the mask, stencil, template, etc., that was used to create selective exposure patterns on the coated substrate prior to development.

The relief pattern of photoresist on substrate produced by the method described above is useful for various applications including, for example, as an exposure mask or a pattern such as is employed in the manufacture of miniaturized integrated electronic components.

The properties of a photoresist composition which are important in commercial practice include the photospeed of the resist, development contrast, resist resolution, and resist adhesion.

Increased photospeed is important for a photoresist, particularly in applications where a number of exposures are needed, for example, in generating multiple patterns by a repeated process, or where light of reduced intensity is employed such as, in projection exposure techniques where the light is passed through a series of lenses and mono-chromatic filters. Thus, increased photospeed is particularly important for a resist composition employed in processes where a number of multiple exposures must be made to produce a mask or series of circuit patterns on a substrate. These optimum conditions include a constant development temperature and time in a particular development mode, and a developer system selected to provide complete development of exposed resist areas while maintaining a maximum unexposed resist film thickness loss not exceeding 10 percent of its initial thickness.

Development contrast refers to a comparison between the percentage of film loss in the exposed area of development with the percentage of film loss on the unexposed area. Ordinarily, development of an exposed resist coated substrate is continued until the coating on the exposed area is substantially completely dissolved away and thus, development contrast can be determined simply by measuring the percentage of the film coating loss in the unexposed areas when the exposed coating areas are removed entirely.

Resist resolution refers to the capability of a resist system to reproduce the smallest equally spaced line pairs and intervening spaces of a mask which is utilized during exposure with a high degree of image edge acuity in the developed exposed spaces.

In many industrial applications, particularly in the manufacture of miniaturized electronic components, a photoresist is required to provide a high degree of resolution for very small line and space widths (on the order of one micron or less).

The ability of a resist to reproduce very small dimensions, on the order of a micron or less, is extremely important in the production of large scale integrated circuits on silicon chips and similar components. Circuit density on such a chip can only be increased, assuming photolithography techniques are utilized, by increasing the resolution capabilities of the resist.

One approach to increasing the resolution capabilities of a resist is to expose with shorter wavelength light. For example, exposures with mid-UV radiation (about 295–380 nm) typically give on the order of 0.25 $\mu$m better resolution than exposures in the near UV region (about 380–459 nm). A persistent difficulty with this approach has been the inability to find a sensitizer that has sufficient photospeed and contrast in the mid-UV region.

The present invention provides an improved positive working photoresist composition which demonstrates substantially increased photospeed while retaining or improving the resist contrast in the mid-UV region.

SUMMARY OF THE INVENTION

The invention provides a method for producing an article which comprises coating a composition comprising a novolak resin and a 1-naphthalene sulfonic acid, 3-diazo-3,4-dihydro-4-oxo-,4-benzoyl-1,2,3-benzenetriyl ester photosensitizer onto a substrate; imagewise exposing said composition to sufficient ultraviolet radiation from a source which produces such radiation at wavelengths which are substantially all of less than 380 nm to render said imagewise exposed portions substantially soluble in an aqueous alkaline solution; and then removing the thusly exposed composition portions from said substrates with an aqueous alkaline developing solution.

The photoresist compositions of the present invention, in addition to exhibiting increased photospeed and contrast in the mid-UV region of the light spectrum, in comparison with prior art positive photoresists, also exhibit a high degree of resolution and good adhesion properties.

DETAILED DESCRIPTION OF THE PREFERRED EMBODIMENT

The preferred composition useful for the method of the invention contains a novolak resin; 1-naphthalene sulfonic acid, 3-diazo-3,4-dihydro-4-oxo-,4-benzoyl-1,2,3,-benzenetriyl ester as the photosensitizer and a suitable solvent composition.

The production of novolak resins, which may be used for preparing photosensitive compositions, is well known in the art. A procedure for their manufacture is described in *Chemistry and Application of Phenolic Resins,* Knop A. and Scheib, W.; Springer Verlag, New York, 1979 in Chapter 4 which is incorporated herein by reference.

The choice of solvent depends on the intended coating process, the desired coating thicknesses and the drying conditions. Suitable solvents for the composition of the invention include ethers (e.g. tetrahydrofuran), alcohols (e.g. n-propanol), alcohol-ethers (e.g. ethylene glycol monoethyl ether), esters (e.g. butyl acetate), aromatic or aliphatic hydrocarbons (e.g. xylene) or mixtures of solvents may also be used. In principal, all solvents which do not react irreversibly with the components of the coating can be used. Partial ethers of glycols, especially ethylene or propylene glycol monoethyl ether, or their esters are particularly preferred. A preferred solvent composition comprises ethylene glycol methyl ether acetate.

The composition of the invention uses a naphthoquinone diazide which is described in European patent application No. 0 092 444 and which may be synthesized by a process similar to that disclosed in U.S. Pat. No. 3,046,118, both of which are incorporated herein by reference. The photosensitizer of our invention is referred to as 2,3,4-trihydroxybenzophenone-1,2-naphthoquinone diazide-4-sulfonic acid triester in European patent application No. 0092444. One manufacturing procedure may be illustrated as follows:

To a 2 liter flask protected from light charge 11.5 grams 2,3,4-trihydroxybenzophenone plus 44.5 grams naphthoquinone (1,2)-diazide-(2)-4-sulfonyl chloride plus 300 ml dioxane. With stirring, over a period of about 5 minutes, add in 250 ml of a 10% solution of sodium carbonate in water. Stir an additional fifteen minutes, then slowly add with stirring 87.5 ml of a 15% hydrochloric acid solution in water. Then slowly add 750 ml water. The product, which has precipitated as a tarry mass, is then stirred for one hour, filtered off and washed with water. The isolated product is slurried into 250 ml of a 5% disodium phosphate solution in water and stirred overnight after which it is filtered and washed neutral with water. The product is then slurried into 225 ml ethanol, stirred for 2½ hours, filtered and washed with 250 ml ethanol. The product is then slurried in water, filtered and washed with water until the runout is clear. The product is then dried. Recovery is 28.8 grams, 62.2% of theory. Appearance is a brownish powder.

In the preferred embodiment, the solid parts of the photoresist composition, that is the novolak and diazide, preferably range from 75% to about 99% novolak resin and from about 1% to about 25% quinone diazide. A more preferred range of novolak resin would be from about 80% to about 90% and most preferably from about 82% to about 85% by weight of the solid resist parts. A more preferred range of the diazide would be from about 1% to about 20% and more preferably from about 15% to about 18% by weight of the solid resist parts. In manufacturing the resist composition the novolak and diazide are mixed with a solvent such that the solvent is present in an amount of from about 50% to about 90% by weight of the overall resist composition. A more preferred range for the solvent is from about 70% to about 80% and most preferably from about 74% to about 76% by weight of the overall resist composition. For the purpose of this invention, the diazide component of the resist composition comprises 1-naphthalene sulfonic acid-3-diazo-3,4-dihydro-4-oxo-,4-benzoyl-1,2,3-benzentriyl ester, more preferably, the diazide component consists essentially of this particular diazide. Here, consisting essentially of means less than 10%, preferably substantially less than 10% of the diazide component is present in the form of other diazides. In the most preferred embodiment, the diazide component consists of this specific diazide compound exclusively.

Additives such as colorants, dyes, anti-striation agents, plasticizers, adhesion promoters, speed enhancers, solvents and such surfactants as non-ionic surfactants may be added to the solution of novolak resin, sensitizer and solvent before the solution is coated onto a substrate.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used up to a five percent weight level, based on the combined weight of novolak and sensitizer.

Plasticizers which may be used include, for example, phosphoric acid tri-($\beta$-chloroethyl)-ester; stearic acid; dicamphor; polypropylene; acetal resins; phenoxy resins; and alkyl resins at one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, $\beta$-(3,4-epoxy-cyclohexyl)-ethyltrimethoxysilane; p-methyldisilane-methyl methacrylate; vinyltrichlorosilane; and $\gamma$-amino-propyl triethoxysilane up to a 4 percent weight level, based on the combined weight of novolak and sensitizer.

Speed enhancers that may be used include, for example, picric acid, nicotinic acid or nitrocinnamic acid at a weight level of up to 20 percent, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed. That is, while the exposed areas of the photoresist coating will be dissolved more quickly by the developer, the speed enhancers will also cause a larger loss of photoresist coating from the unexposed areas.

Solvents may include xylene, butyl acetate and Cellosolve acetate, among others.

Non-ionic surfactants that may be used include, for example, nonylphenoxy poly(ethyleneoxy) ethanol;

octylphenoxy (ethyleneoxy) ethanol; and dinonyl phenoxy poly(ethyleneoxy) ethanol at up to 10 percent weight levels, based on the combined weight of novolak and sensitizer.

The prepared resist solution can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters. The substrate may also comprise doped silicon dioxide, silicon nitride, tantalum, copper, polysilicon, ceramics and aluminum/copper mixtures.

After the resist composition solution is coated onto the substrate, the substrate is baked at approximately 85° to 90° C., until substantially all the solvent has evaporated and only a thin coating of photoresist composition on the order of a micron in thickness remains on the substrate. The coated substrate can then be exposed to actinic radiation especially ultraviolet radiation in the less than 380 nm range, preferably 295–380 nm in any desired exposure pattern, produced by use of suitable photomasks, negatives, stencils, templates, projection means, etc. In a more preferred embodiment the uv exposure range is from about 295–350 nm and most preferably 295–325 nm.

The exposed resist-coated substrates are next substantially immersed in alkaline developing solution. The solution is preferably agitated, for example, by nitrogen burst agitation. The substrates are allowed to remain in the developer until all, or substantially all, of the resist coating has dissolved from the exposed areas.

After removal of the coated wafers from the developing solution, a post-development heat treatment or bake may be employed to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The resist compositions of the present invention are resistant to acid-base etching solutions and provide effective protection for the unexposed resist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

As a comparative example, two photoresist formulations are prepared as follows:

| Resist A | Resist B |
|---|---|
| Novolak Resin 22.9% | Novolak Resin 24.3% |
| Propylene glycol methyl ether acetate 74.0% | Propylene glycol methyl ether acetate 73.0% |
| 1-Naphthalenesulfonic acid, 3-diazo-3,4-dihydro-4-oxo-,4-benzoyl-1,2,3-benzenetriyl ester 3.1% | 1-Naphthalenesulfonic acid, 6-diazo-5,6-dihydro-5-oxo-,4-benzoyl-1,2,3-benzenetriyl ester 2.7% |

The novolak resin and solvent are identical in Resist A and Resist B. The amounts of photoactive component, and hence diazo nitrogen contents, are comparable.

The resin is dissolved into the solvent by overnight stirring, the photoactive component is then dissolved and the solution passed through 0.2 μm Millipore Teflon filters.

Evaluation for Photosensitivity, Contrast and Unexposed Film Loss

The photoresist is spin-coated on several wafers at a constant, predetermined spinspeed. The wafers are then baked at 90° C. for 30 minutes. The initial film thicknesses of coated resist are measured by a Rudolf Film Thickness Monitor. Photosensitivity is measured by generating a contrast curve as described by G. C. Willson, in "Introduction to Microlithography," Chapter 3, p. 105, American Chemical Society, Washington, D.C. 1983. One plots film thickness loss after one minute development versus the logarithm of the UV exposure dose. Film thickness is monitored by laser interferometry using the technique described. The resists are then developed using AZ 400K Developer, available from American Hoechst Corporation, Somerville, N.J., diluted 1:4 with deionized water at 22° C. By extrapolation of the plot to total film thickness loss, one obtains the photosensitivity value (mJ/cm$^2$) and the slope of this plot is the contrast. The results below are obtained for Resist A and B when exposed in the near UV region (380–450 nm).

|  | Resist A | Resist B |
|---|---|---|
| Photosensitivity (mJ/cm$^2$) | 43 | 50 |
| Contrast | 3.36 | 2.56 |
| Initial Film Thickness (um) | 1.438 | 1.440 |
| Unexposed Film Loss (Å) | 90 | 310 |

The results show that for comparable film thicknesses, Resist A is 16% faster, has a 31% higher contrast and only 29% of the unexposed film loss when exposed in the near UV region of the spectrum.

EXAMPLE 2

Example 1 is repeated using an exposure wavelength in the mid-UV region (310 nm). Also, in this example the developer is changed to include the use of AZ Developer, available from American Hoechst Corporation, Somerville, N.J., diluted 3:1 with deionized water.

|  | Resist A | Resist B |
|---|---|---|
| Photosensitivity (mJ/cm$^2$) | 58 | 133 |
| Contrast | 2.25 | 1.93 |
| Initial Film Thickness (um) | 1.498 | 1.497 |
| Unexposed Film Loss (Å) | 90 | 980 |

The results show that Resist A, when exposed in the mid-UV region (310 nm), demonstrates marked improvement over the isomeric sensitizer used in Resist B. In this case, the photospeed has increased 129%, the contrast is 16% higher, and the unexposed film loss is only 10% of the Resist B formulation.

Plasma Etch Rate

The plasma etch rate of a resist film should be kept as low as possible for dry processing. For this plasma etch rate test, the coated resist samples are baked at 120° C. for 30 minutes. Below are the chlorine plasma etch rates comparing Resists A and B.

Conditions are hexemethyl disilizane vapor treated wafers with 9500 Å Al/2% Cu deposited by sputtering, 1.6 μm thickness of each resist, 120° C./30 min. hardbake, 125 μm Torr, 35° C., 20 SCCM $Cl_2$, 100 SCCM $BCl_3$, 1500 watts.

|  | Etch Ratio (Al:Photoresist) |
| --- | --- |
| Resist A | 3:1 |
| Resist B | 3:1 |

As can be seen from the above data, there is no sacrifice in chlorine plasma etch resistance when comparing the resists.

Spin Curve Characteristics

Spin curves are used to predetermine the thickness of baked resist film from the spin speed of application. These curves must therefore be regular, generating a straight line when plotted as log of film thickness versus log of spin speed. The two resists, Resists A and B, are each spun at various spin speeds as indicated below, baked at 90° C. for 30 minutes, and resist film thickness measured.

| RPM | Resist A (um) | Resist B (um) |
| --- | --- | --- |
| 3,000 | 1.596 | 2.400 |
| 4,000 | 1.413 | 2.100 |
| 5,000 | 1.239 | 1.900 |
| 6,000 | 1.116 | 1.700 |
| 7,000 | 1.001 | 1.600 |

When plotted as indicated, each resist generates a linear curve with high correlation.

These examples illustrate that the use of the sensitizer, 1-naphthalenesulfonic acid, 3-diazo-3,4-dihydro-4-oxo-,4-benzoyl-1,2,3-benzenetriyl ester, produces a resist having an appreciably improved photospeed, especially in the mid-UV region, while substantially retaining the other desirable properties of a resist, such as high contrast, high chlorine plasma resistance and low erosion rate.

What is claimed is:

1. A method for producing an article which comprises coating a composition consisting of a novolak resin and a 2,3,4-trihydroxybenzophenone-1,2-naphthoquinone diazide-4-sulfonic acid triester photosensitizer onto a substrate; imagewise exposing said composition to sufficient ultraviolet radiation from a source which produces such radiation at wavelengths which are substantially all of less than 380 nm to render said imagewise exposed portions substantially soluble in an aqueous alkaline solution; and then removing the thusly exposed composition portions from said substrates with an aqueous alkaline developing solution.

2. The method of claim 1 wherein said photosensitizer is present in said composition in an amount of from about 1% to about 25% based on the weight of said composition.

3. The method of claim 1 wherein said novolak resin is present in said composition in an amount of from about 75% to about 99% based on the solids parts of the composition.

4. The method of claim 1 wherein said substrate comprises one or more components selected from the group consisting of silicon, aluminum, polymeric resins, silicon dioxide, doped silicon dioxide, silicon nitride, tantalum, copper, polysilicon, ceramics and aluminum/copper mixtures.

5. The method of claim 1 wherein the ultraviolet radiation range is from about 295 to about 350 nm.

6. The method of claim 1 wherein the ultraviolet radiation range is from about 295 to about 325 nm.

7. A method for producing an article which comprises coating a composition consisting of a novolak resin, a 2,3,4-trihydroxybenzophenone-1,2-naphthoquinonediazide-4-sulfonic acid triester photosensitizer and at least one solvent onto a substrate; imagewise exposing said composition to sufficient ultraviolet radiation from a source which produces such radiation at wavelengths which are substantially all of less than 380 nm to render said imagewise exposed portions substantially soluble in an aqueous alkaline solution; and then removing the thusly exposed composition portions from said substrate with an aqueous alkaline developing solution.

8. The method of claim 7 wherein the ultraviolet radiation range is from about 295 to about 350 nm.

9. The method of claim 7 wherein the ultraviolet radiation range is from about 295 to about 325 nm.

10. A method for producing an article which comprises coating a composition consisting of a novolak resin, a 2,3,4-trihydroxybenzophenone-1,2-naphthoquinonediazide-4-sulfonic acid triester photosensitizer and one or more additives selected from the group consisting of colorants, anti-striation agents, plasticizers, adhesion promoters, speed enhancers, solvents and surfactants onto a substrate; imagewise exposing said composition to sufficient ultraviolet radiation from a source which produces such radiation at wavelengths which are substantially all of less than 380 nm to render said imagewise exposed portions substantially soluble in an aqueous alkaline solution; and then removing the thusly exposed composition portions from said substrates with an aqueous alkaline developing solution.

11. The method of claim 10 wherein the ultraviolet radiation range is from about 295 to about 350 nm.

12. The method of claim 10 wherein the ultraviolet radiation range is from about 295 to about 325 nm.

13. A method for producing an article which comprises coating a composition consisting of a novolak resin, a 2,3,4-trihydroxybenzophenone-1,2-naphthoquinonediazide-4-sulfonic acid triester photosensitizer and propylene glycol methyl ether acetate onto a substrate; imagewise exposing said composition to sufficient ultraviolet radiation from a source which produces such radiation at wavelengths which are substantially all of less than 380 nm to render said imagewise exposed portions substantially soluble in an aqueous alkaline solution; and then removing the thusly exposed composition portions from said substrates with an aqueous alkaline developing solution.

14. The method of claim 13 wherein the ultraviolet radiation range is from about 295 to about 350 nm.

15. The method of claim 13 wherein the ultraviolet radiation range is from about 295 to about 325 nm.

* * * * *